US008846485B2

(12) United States Patent
Kobayashi et al.

(10) Patent No.: US 8,846,485 B2
(45) Date of Patent: Sep. 30, 2014

(54) METHOD FOR FABRICATING BOTTOM ELECTRODE OF CAPACITORS OF DRAM

(75) Inventors: Heiji Kobayashi, Hsinchu (TW); Yukihiro Nagai, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 305 days.

(21) Appl. No.: 12/837,449

(22) Filed: Jul. 15, 2010

(65) Prior Publication Data

US 2012/0015494 A1    Jan. 19, 2012

(51) Int. Cl.
 *H01L 21/20* (2006.01)
(52) U.S. Cl.
 USPC .................................. 438/386; 257/E21.011
(58) Field of Classification Search
 CPC ............... H01L 27/10852; H01L 27/10894; H01L 27/10844; H01L 28/91; H01L 27/10814
 USPC .................................. 438/386; 257/E21.011
 See application file for complete search history.

(56) References Cited

U.S. PATENT DOCUMENTS

| 5,354,716 | A  | * | 10/1994 | Pors et al. ..................... 438/396 |
| 5,650,349 | A  | * | 7/1997  | Prall et al. ..................... 438/307 |
| 6,222,722 | B1 |   | 4/2001  | Fukuzumi et al. |
| 2002/0102807 | A1 | * | 8/2002 | Kim et al. ..................... 438/386 |
| 2003/0049905 | A1 | * | 3/2003 | Nitta et al. ..................... 438/258 |
| 2005/0037567 | A1 | * | 2/2005 | Tsai et al. ..................... 438/249 |
| 2006/0057794 | A1 | * | 3/2006 | Youn et al. ..................... 438/197 |
| 2007/0045666 | A1 | * | 3/2007 | Cho ............................. 257/211 |
| 2007/0284641 | A1 |   | 12/2007 | Seo |
| 2010/0019302 | A1 | * | 1/2010  | Lee et al. ..................... 257/306 |
| 2011/0117718 | A1 | * | 5/2011  | Nakamura et al. ............ 438/387 |

\* cited by examiner

*Primary Examiner* — Duy T Nguyen
(74) *Attorney, Agent, or Firm* — Jianq Chyun IP Office

(57) ABSTRACT

A method for manufacturing a capacitor bottom electrode of a dynamic random access memory is provided. The method comprises providing a substrate having a memory cell region and forming a polysilicon template layer on the memory cell region of the substrate. A supporting layer is formed on the polysilicon template layer and plural openings penetrating through the supporting layer and the polysilicon template layer are formed and a liner layer is formed on at least a portion of the polysilicon template layer exposed by the openings. A conductive layer substantially conformal to the substrate is formed on the substrate. A portion of the conductive layer on the supporting layer is removed so as to form plural capacitor bottom electrodes. Using the polysilicon template layer, the openings with relatively better profiles are formed and the dimension of the device can be decreased.

13 Claims, 3 Drawing Sheets

METHOD FOR FABRICATING BOTTOM ELECTRODE OF CAPACITORS OF DRAM

BACKGROUND OF THE INVENTION

1. Field of the Invention

The present invention relates to a method of manufacturing a memory device, and more particularly to a method of manufacturing a bottom electrode of a capacitor of a dynamic random access memory (DRAM).

2. Description of Related Art

Capacitors in the dynamic random access memory (DRAM) are used to store data. The data of each of the memory cells is determined by the charges stored in the corresponding capacitor. The structure of capacitor of DRAM is normally grouped into two major kinds namely, the stack capacitor and the deep trench capacitor. Regardless of the stack capacitor or the deep trench capacitor, the manufacturing technique confronts more and more difficulties under the demands of the small dimension of the semiconductor device.

The crown type capacitors are the stack capacitors widely used in the industry. Generally, the method for manufacturing the crown type capacitor includes forming openings in the silicon oxide template layer, and then depositing conformal conductive layer in the openings and on the silicon oxide template layer. Further, a portion of the conductive layer is removed to isolate different capacitors. Finally, the silicon oxide template layer is removed to form a bottom electrode of the crown type capacitor.

However, with the increasing of the integration of the DRAM, the memory dimension and the area of the capacitor of the DRAM is decreased. Thus, the dimensions of the openings in the silicon oxide template layer for forming the bottom electrode of the crown type capacitor are decreased and the aspect ratio of each of the openings is increased. Since it is not easy to etch the silicon oxide, the lateral etching occurs at the sidewall of the top of each of the openings while the openings are formed. With the increasing of the aspect ratio, the time for performing the etching process is increased and the lateral etching at the sidewall of the top of each opening is much more serious. When the lateral etching at the sidewall of the top of the opening in the silicon oxide template layer is too serious, the adjacent openings communicate to each other at the location on the sidewall where the lateral etching occurs. Hence, the short occurs between the later formed adjacent bottom electrodes corresponding to the adjacent openings. Therefore, it is difficult to decrease the distance between the adjacent openings. Thus, it is hard to increase the lateral area occupied by each of the capacitors or it is hard to increase the integration of the DRAM.

SUMMARY OF THE INVENTION

Accordingly, the present invention provides a method for manufacturing a capacitor bottom electrode of a DRAM capable of producing openings with better profiles (less lateral etching) so that the dimension of the device can be decreased.

The present invention provides a method of manufacturing a capacitor bottom electrode of a dynamic random access memory. The method includes the following steps. A substrate having a memory cell region is provided. A polysilicon template layer is formed on the memory cell region of the substrate. A supporting layer is formed on the polysilicon template layer. A plurality of openings are formed to penetrate through the supporting layer and the polysilicon template layer. A liner layer is formed on at least a portion of the polysilicon template layer exposed by the openings. The portion of the liner layer at the bottom of the openings is removed. A conductive layer conformal to the substrate is formed on the substrate. A portion of the conductive layer on the supporting layer is removed so as to form a plurality of capacitor bottom electrodes.

According to one embodiment of the present invention, the aforementioned method of manufacturing a capacitor bottom electrode of a dynamic random access memory further includes following steps. A sealing layer is formed over the substrate to seal the openings. A portion of the sealing layer and a portion of the supporting layer are removed to expose the liner layer and the polysilicon template layer. The rest portion of the sealing layer, the liner layer and the polysilicon template layer are removed.

According to one embodiment of the present invention, the aforementioned substrate further includes a peripheral circuit region and the step of forming the polysilicon template layer on the memory cell region of the substrate includes following steps. A polysilicon layer is formed on the substrate. A portion of the polysilicon layer on the peripheral circuit region is removed. An insulating layer is formed on the peripheral circuit region of the substrate.

According to one embodiment of the present invention, the aforementioned substrate further includes a peripheral circuit region and the step of forming the polysilicon template layer on the memory cell region of the substrate includes following steps. An insulating layer is formed on the substrate. A portion of the insulating layer on the memory cell region is removed. A polysilicon layer is formed on the memory cell region of the substrate.

According to one embodiment of the present invention, a method of forming the aforementioned liner layer includes a thermal oxidation or a chemical vapor deposition.

According to one embodiment of the present invention, after the step of forming the openings penetrating through the supporting layer and the polysilicon template layer, the aforementioned method of manufacturing a capacitor bottom electrode of a dynamic random access memory further includes removing a portion of the polysilicon template layer to enlarge a width of each of the openings. A method of removing the portion of the polysilicon template layer to enlarge the width of each of the openings includes a wet etching process. A method of forming the aforementioned liner layer includes a thermal oxidation or a chemical vapor deposition.

According to one embodiment of the present invention, before the step of forming the polysilicon template layer on the memory cell region of the substrate, the aforementioned method of manufacturing a capacitor bottom electrode of a dynamic random access memory further includes forming a pad layer on the substrate.

According to one embodiment of the present invention, before the step of forming the conductive layer, the aforementioned method of manufacturing a capacitor bottom electrode of a dynamic random access memory further includes removing a portion of the liner layer and a portion of the pad layer to expose a conductive structure in the substrate.

According to one embodiment of the present invention, a method for removing the rest of the sealing layer, the liner layer and the polysilicon template layer includes a wet etching process.

According to one embodiment of the present invention, a method of forming the polysilicon template layer includes a chemical vapor deposition.

According to one embodiment of the present invention, a material of the supporting layer includes silicon nitride or silicon oxide.

According to one embodiment of the present invention, the conductive layer includes a complex layer composed of titanium nitride and titanium.

In the method of manufacturing a capacitor bottom electrode of a dynamic random access memory of the present invention, the polysilicon template layer is used to produce openings with better profiles (less lateral etching). Furthermore, the portion of the polysilicon template layer exposed by the openings is covered by the liner layer so that the polysilicon template layer can be protected from reacting with the later formed conductive layer to form metal silicide.

Moreover, since the insulating layer is formed on the peripheral circuit region, there is no the step height between the memory cell region and the peripheral circuit region. The insulating layer can also prevent the devices in the peripheral circuit region from being damaged by the permeating etchant while the film layers (such as the polysilicon template layer) on the memory cell region are removed. In addition, the peripheral circuit region, the region out of the memory cell region, for example, the region out of the chip, the dicing line region, can be used as alignment mark area in the photolithography process.

To make the above and other features and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1F are cross-sectional views illustrating a method for manufacturing a capacitor of a dynamic random access memory according to one embodiment of the present invention.

Figure 1A:
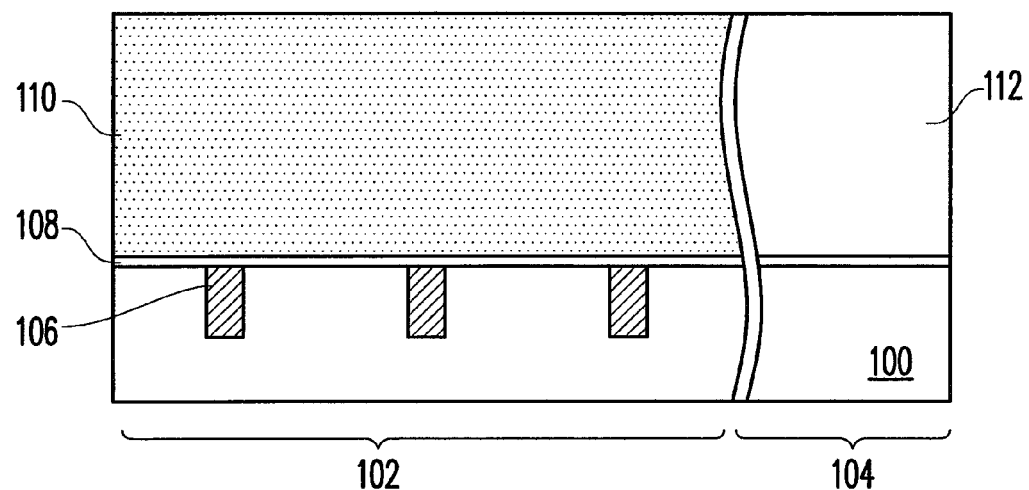
FIGS. 1A through 1F are cross-sectional views illustrating a method for manufacturing a capacitor of a dynamic random access memory according to one embodiment of the present invention.

As shown in FIG. 1A, a substrate 100 is provided. The substrate 100 is divided into a memory cell region 102 and a peripheral circuit region 104. A plurality of MOS transistors (not shown) and a plurality of conductive structures 106 are formed on the memory cell region 102 of the substrate 100. The conductive structures 106 can be, for example, contact windows of sources/drains or plugs electrically connected to the contact windows of the sources/drains. Then, a pad layer 108 is optionally formed on the substrate 100. A material of the pad layer 108 can be, for example, silicon nitride or silicon oxide. The pad layer 108 is, for example, formed by a chemical vapor deposition.

Thereafter, a polysilicon template layer 110 and an insulating layer 112 are respectively formed on the memory cell region 102 and the peripheral circuit region 104 of the substrate 100; in another embodiment, a polysilicon template layer 110 may be only formed on the memory cell region 102 and the peripheral circuit region 104 of the substrate 100. The steps for forming the polysilicon template layer 110 and the insulating layer 112 respectively on the memory cell region 102 and the peripheral circuit region 104 of the substrate 100 are shown as followings.

After a layer of polysilicon layer is formed on the substrate 100, a patterned photoresist layer (not shown) is formed on the substrate 100 to cover the polysilicon layer on the memory cell region 102 and to expose the polysilicon layer on the peripheral circuit region 104. Then, by using the patterned photoresist layer as a mask, a portion of the polysilicon layer is removed so that the polysilicon template layer 110 remains on the memory cell region 102. After the patterned photoresist layer is removed, a layer of insulating material layer is formed on the substrate 100. Thereafter, by using the processes such as etching back or chemical-mechanical polishing, the insulating material layer on the memory cell region 102 is removed so that the insulating layer 112 remains on the peripheral circuit region 104. A material of the insulating layer 112 can be, for example, TEOS silicon oxide formed by the atmosphere pressure chemical vapor deposition with the use of tetetraethylorthosilicate (TEOS) as the reaction gas, BPTEOS silicon oxide having boron and phosphorous or borophosphosilicate glass (BPSG). The surface of the polysilicon template layer 110 on the memory cell region 102 and the surface of the insulating layer 112 on the peripheral circuit region 104 are at the same plane. That is, the height level of the surface of the polysilicon template layer 110 on the memory cell region 102 is substantially equal to the height level of the surface of the insulating layer 112 on the peripheral circuit region 104.

In another embodiment, a layer of insulating material layer can be formed on the substrate 100 in advance. Then, a layer of patterned photoresist layer (not shown) is formed on the substrate 100 to cover the insulating material layer on the peripheral circuit region 104 and to expose the insulating material layer on the memory cell region 102. Thereafter, the insulating material layer on the memory cell region 102 is removed by using the patterned photoresist layer as a mask. After the patterned photoresist layer is removed, a layer of polysilicon layer is formed on the substrate 100. Then, using the processes such as etching back or chemical-mechanical polishing, the polysilicon layer on the peripheral circuit region 104 is removed so that the polysilicon template layer 110 remains on the memory cell region 102.

Since the insulating layer 112 is formed on the peripheral circuit region 104, the insulating layer 112 can protect the devices in the peripheral circuit region from being damaged by the permeating etchant while the film layers (such as the polysilicon template layer 110) are removed from the memory cell region. Moreover, during the photolithography process, the peripheral circuit region 104 covered by the insulating layer 112 can be used for alignment due to the opaque polysilicon in the memory cell region 102. In addition, the peripheral circuit region 104, the region out of the memory cell region 102, for example, the region out of the chip, the dicing line region, can be used as alignment mark area in the photolithography process. Also, the surface of the polysilicon template layer 110 on the memory cell region 102 and the surface of the insulating layer 112 on the peripheral circuit region 104 are at the same plane or at the same height level so that there is no step height between the memory cell region 102 and the peripheral circuit region 104. Thus, the process difference between the memory cell region 102 and the peripheral circuit region 104 can be decreased.

Figure 1B:
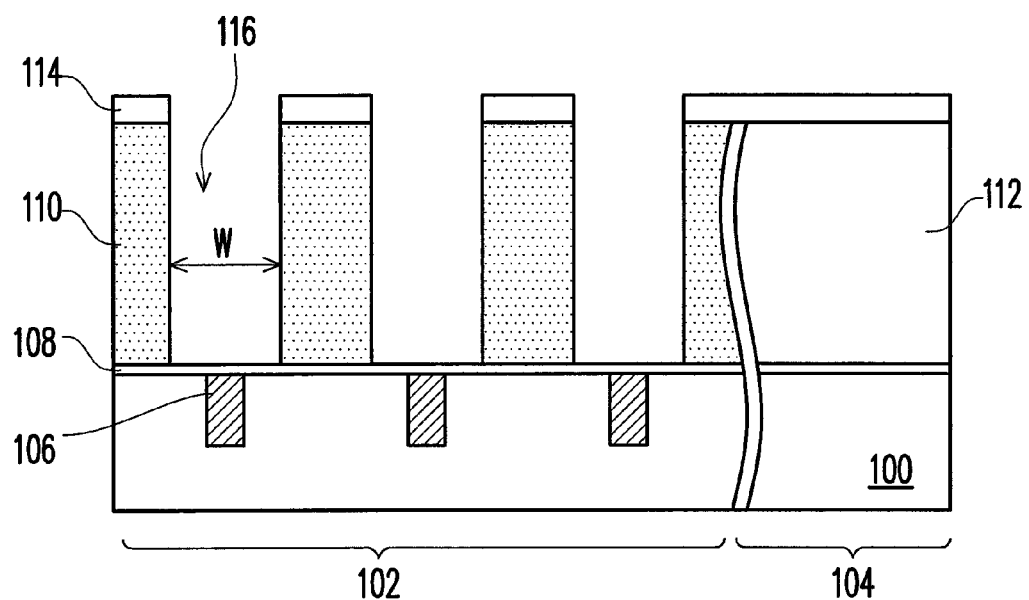

As shown in FIG. 1B, a supporting layer 114 is formed on the substrate 100. The supporting layer 114 can be made of, for example, silicon nitride or silicon oxide. The method of forming the supporting layer 114 can be, for example, a chemical vapor deposition. Then, a layer of patterned photoresist layer (not shown) having an opening pattern is formed for defining template openings for forming the capacitor bottom electrode. Using the patterned photoresist layer as a mask, an anisotropic etching process is performed to form a plurality of openings 116 penetrating through the supporting layer 114 and the polysilicon template layer 110. If the pad layer 108 is formed between the polysilicon template layer 110 and the substrate 100, the pad layer 108 can be used as an etching stop layer while the openings 116 are formed. The patterned photoresist layer is then removed. Each of the openings 116 has, for example, a width W. Since etching away the polysilicon is easier than etching away the silicon oxide during the anisotropic etching process, the polysilicon template layer is used to manufacture the openings having relatively better profile (less lateral etching) while each opening possesses relatively high aspect ratio.

Figure 1C:
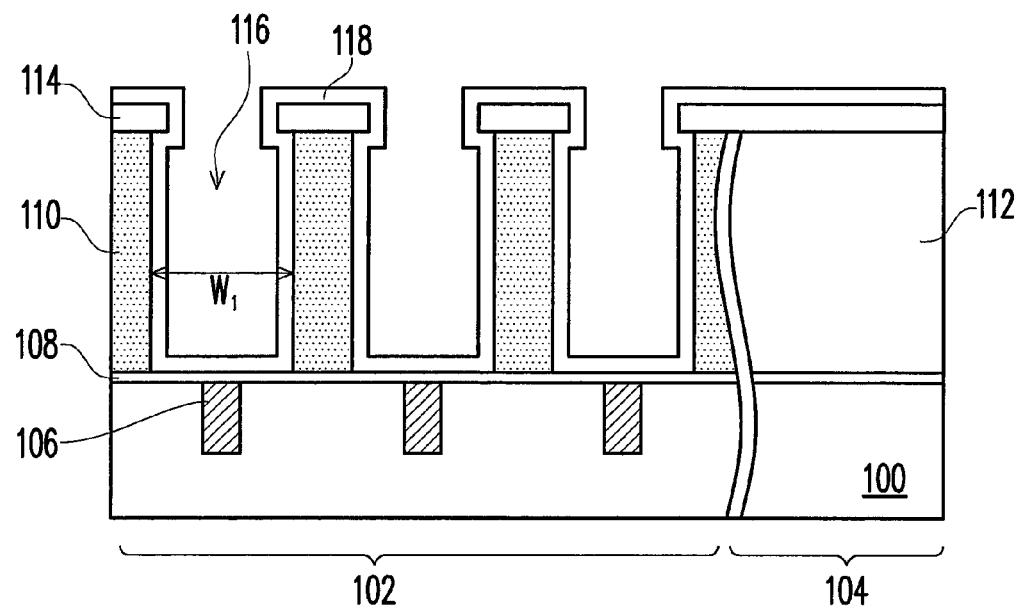

As shown in FIG. 1C, a portion of the polysilicon template layer 110 are removed to enlarge the width W of each opening 116. Accordingly, each opening 116 has a width W1. In another embodiment, it is not necessary to perform the step of enlarging the openings 116.

Next, a liner layer 118 is formed on the substrate 100. The material of the liner layer 118 can be, for example, silicon oxide, and the method for forming the liner layer can be, for example, a thermal oxidation or a chemical vapor deposition. In the present embodiment, the liner layer 118 is formed by the chemical vapor deposition so that the liner layer 118 covers the entire substrate 100. In another embodiment, if the liner layer 118 is formed by the thermal oxidation, the liner layer 118 is formed on the polysilicon template layer 110 exposed by the openings 116. The liner layer 118 can prevent the polysilicon template layer 110 from reacting with the later formed conductive layer so that the liner layer 118 only covers the polysilicon template layer 110 exposed by the openings 116.

Figure 1D:
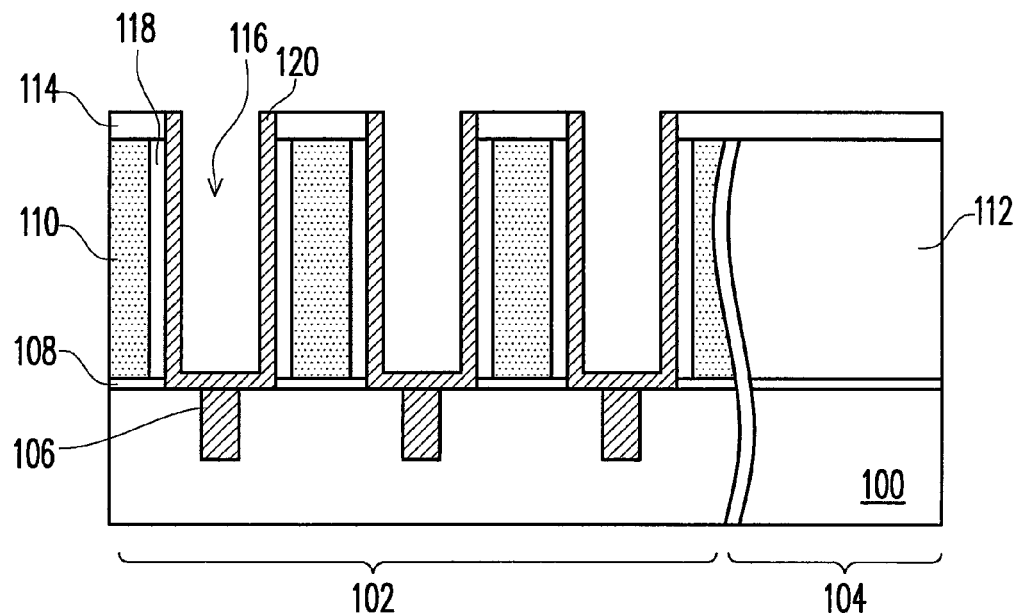

As shown in FIG. 1D, a portion of the liner layer 118 and a portion of the pad layer 108 are removed to expose the conductive structures 106 in the substrate 100. The portion of the liner layer 118 at the bottom of the openings 116 is removed. The method for removing the portion of the liner layer 118 and the portion of the pad layer 108 can be, for example, an anisotropic etching process. Meanwhile, the liner layer 118 covering the polysilicon template layer 110 exposed by the openings 116 is not removed. Then, a conductive layer substantially conformal to the substrate 100 is formed on the substrate 100. That is, the conductive layer is formed on the bottoms and the sidewalls of the openings 116 and on the supporting layer 114. Thereafter, a portion of the conductive layer on the supporting layer 114 is removed so as to form a plurality of capacitor bottom electrodes 120. The portion of the conductive layer on the supporting layer 114 is removed by, for example, etching back or chemical-mechanical polishing. The material of the capacitor bottom electrodes 120 can be, for example, titanium and/or titanium nitride. The thickness of each of the capacitor bottom electrodes 120 is about 10~300 angstroms. The liner layer 118 is formed between the capacitor bottom electrodes 120 and the polysilicon template layer 110 and the liner layer 118 can prevent polysilicon from reacting with the titanium and/or titanium nitride to form the titanium silicide.

Figure 1E:
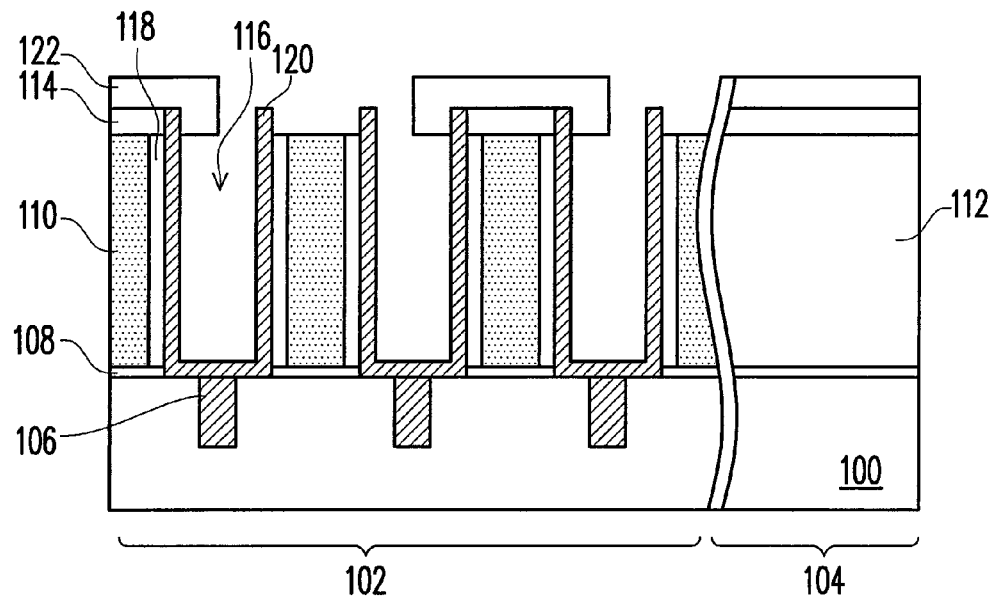

As shown in FIG. 1E, a sealing layer 122 is formed to seal the openings 116. The material of the sealing layer 122 can be, for example, silicon oxide and the thickness of the sealing layer 122 is about 30~200 nm. A portion of the sealing layer 122 and a portion of the supporting layer 114 are removed to expose a portion of the liner layer 118 and the polysilicon template layer 110. The method for removing the portion of the sealing layer 122 and the portion of the supporting layer 114 can be, for example, a dry etching process.

Figure 1F:
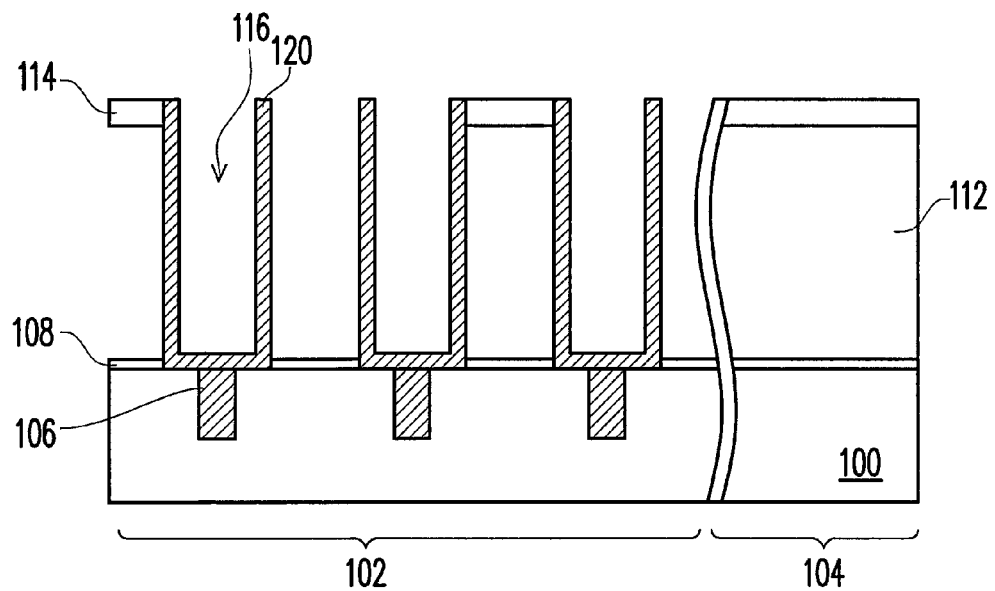

As shown in FIG. 1F, the rest of the sealing layer 122, the liner layer 118 and the polysilicon template layer 110 are removed by, for example, a wet etching process with using the solution containing ammonia and hydrofluoric acid as the etchant. The later performed processes for completing the formation of capacitors of the DRAM are well known by people skilled in the art and are not detailed herein.

Altogether, in the method of manufacturing a capacitor bottom electrode of a dynamic random access memory of the present invention, the polysilicon template layer is used to produce openings with better profiles (less lateral etching).

Furthermore, the portion of the polysilicon template layer exposed by the openings is covered by the liner layer so that the polysilicon (polysilicon template layer) can be protected from reacting with the titanium and/or titanium nitride (the capacitor bottom electrode) to form metal silicide.

Since the insulating layer is formed on the peripheral circuit region, there is no step height between the memory cell region and the peripheral circuit region. The insulating layer can also prevent the devices in the peripheral circuit region from being damaged by the permeating etchant while the film layers (such as the polysilicon template layer) on the memory cell region are removed. In addition, the peripheral circuit region, the region out of the memory cell region, for example, the region out of the chip, the dicing line region, can be used as alignment area in the photolithography process.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A method of manufacturing a capacitor bottom electrode of a dynamic random access memory, comprising:
    providing a substrate having a memory cell region and a peripheral circuit region;
    forming a polysilicon template layer only on the memory cell region of the substrate and forming an insulating layer only on the peripheral circuit region of the substrate, wherein the polysilicon template layer and the insulating layer are substantially coplanar;
    forming a supporting layer on the polysilicon template layer;
    forming a plurality of openings penetrating through the supporting layer and the polysilicon template layer;
    forming a liner layer on at least a portion of the polysilicon template layer exposed by the openings;
    forming a conductive layer on the substrate, wherein the conductive layer is substantially conformal to the polysilicon template layer on the memory cell region of the substrate;
    removing a portion of the conductive layer on the supporting layer so as to form a plurality of capacitor bottom electrodes, wherein the liner layer is disposed between the polysilicon template layer and each of the capacitor bottom electrodes;
    forming a sealing layer to seal the openings after the step of forming the capacitor bottom electrodes;
    removing a portion of the sealing layer and a portion of the supporting layer to expose the liner layer and the polysilicon template layer; and
    removing the rest portion of the sealing layer, the liner layer and the polysilicon template layer.

2. The method of claim 1, wherein the step for forming the polysilicon template layer on the memory cell region of the substrate comprises:

forming a polysilicon layer on the substrate;
removing a portion of the polysilicon layer on the peripheral circuit region; and
forming the insulating layer on the peripheral circuit region of the substrate.

3. The method of claim 1, wherein the step for forming the polysilicon template layer on the memory cell region of the substrate comprises:
forming the insulating layer on the substrate;
removing a portion of the insulating layer on the memory cell region; and
forming the polysilicon template layer on the memory cell region of the substrate.

4. The method of claim 1, wherein the step of forming the liner layer comprises performing a thermal oxidation or a chemical vapor deposition.

5. The method of claim 1, after the step of forming the openings penetrating through the supporting layer and the polysilicon template layer, further comprising:
removing a portion of the polysilicon template layer to enlarge a width of each of the openings.

6. The method of claim 5, wherein the step of removing the portion of the polysilicon template layer to enlarge the width of each of the openings comprises performing a wet etching process.

7. The method of claim 5, wherein the step of forming the liner layer comprises performing a thermal oxidation or a chemical vapor deposition.

8. The method of claim 1, before the step of forming the polysilicon template layer on the memory cell region of the substrate, further comprising forming a pad layer on the substrate.

9. The method of claim 8, before the step of forming the conductive layer on the substrate, further comprising removing a portion of the liner layer and a portion of the pad layer to expose a conductive structure in the substrate.

10. The method of claim 1, wherein the step of removing the rest of the sealing layer, the liner layer and the polysilicon template layer comprises performing a wet etching process.

11. The method of claim 1, wherein the step of forming the polysilicon template layer comprises performing a chemical vapor deposition.

12. The method of claim 1, wherein a material of the supporting layer comprises silicon nitride or silicon oxide.

13. The method of claim 1, wherein the conductive layer includes a complex layer composed of titanium nitride and titanium.

* * * * *